United States Patent
Yokoyama et al.

(10) Patent No.: US 7,965,037 B2
(45) Date of Patent: Jun. 21, 2011

(54) ORGANIC ELECTROLUMINESCENCE DEVICE AND ORGANIC LASER DIODE

(75) Inventors: Daisuke Yokoyama, Fukuoka (JP); Hajime Nakanotani, Fukuoka (JP); Masayuki Yahiro, Fukuoka (JP); Chihaya Adachi, Fukuoka (JP); Masato Moriwake, Kyoto (JP); Dai Ohnishi, Kyoto (JP); Yousuke Setoguchi, Fukuoka (JP)

(73) Assignees: Kyushu University, National University Corporation, Fukuoka (JP); Rohm Co., Ltd., Kyoto (JP)

( * ) Notice: Subject to any disclaimer, the term of this patent is extended or adjusted under 35 U.S.C. 154(b) by 293 days.

(21) Appl. No.: 12/192,194

(22) Filed: Aug. 15, 2008

(65) Prior Publication Data

US 2009/0058274 A1 Mar. 5, 2009

(30) Foreign Application Priority Data

Aug. 17, 2007 (JP) .................................. 2007-212863

(51) Int. Cl.
*H01J 1/62* (2006.01)
(52) U.S. Cl. .................. 313/506; 313/504; 313/509
(58) Field of Classification Search .......... 313/498–512
See application file for complete search history.

(56) References Cited

U.S. PATENT DOCUMENTS

| 6,631,147 B2* | 10/2003 | Taniguchi et al. ............. 372/39 |
| 2005/0047458 A1* | 3/2005 | Nomura et al. .............. 372/39 |
| 2006/0133437 A1* | 6/2006 | Forrest et al. .............. 372/39 |
| 2009/0052491 A1* | 2/2009 | Nomura et al. ............. 372/50.11 |
| 2010/0172388 A1* | 7/2010 | Hwang et al. ............. 372/45.013 |

OTHER PUBLICATIONS

Aimono, Takanori et al., "100% fluorescence efficiency of 4,4'-bis[(*N*-carbazole)styryl]biphenyl in a solid film and the very low amplified spontaneous emission threshold", Applied Physics Letters 86, pp. 071110-1 to 071110-3, 2005.
Nakanotani, Hajime et al., "Spectrally narrow emission from organic films under continuous-wave excitation", Applied Physics Letters 90, pp. 1-1 to 1-3, 2007.

* cited by examiner

*Primary Examiner* — Bumsuk Won
(74) *Attorney, Agent, or Firm* — Rabin & Berdo, P.C.

(57) ABSTRACT

An organic electroluminescence device, includes a substrate; an anode layer; an organic layer including at least one organic material having a fluorescence spectrum; and a cathode layer, wherein the organic electroluminescence device has a primary light outgoing direction that is parallel to a surface of the substrate, wherein the organic electroluminescence device has an optical waveguide that includes a core layer formed by the anode layer and the organic layer, and a clad layer formed by the substrate and the cathode layer, and wherein the optical waveguide has cutoff wavelengths in a transverse electric mode any one of which is within a wavelength range of a full width at half maximum of the fluorescence spectrum of any one of the organic materials included in the organic layer.

22 Claims, 9 Drawing Sheets

ORGANIC ELECTROLUMINESCENCE DEVICE AND ORGANIC LASER DIODE

BACKGROUND OF THE INVENTION

1. Field of the Invention

The present invention relates to an organic electroluminescence device (which may also be referred to as an "organic EL device" hereinafter) and an organic laser diode, and particularly to an organic EL device and an organic laser diode that can emit light of an extremely narrow spectral width even with a lower current density.

2. Description of the Background Art

An organic semiconductor light emitting device such as an organic EL device has a simpler device structure than an inorganic semiconductor light emitting device, and can provide light of a shorter wavelength, e.g., from about 400 nm to about 550 nm so that it can have a larger capacity (higher recording density). Therefore, application to various fields has been expected, and search and development thereof have been actively conducted in recent years.

Actualization of an organic laser diode has been expected as a next-generation technology following the organic EL device. It can be considered that when the organic laser diode is actualized, a laser diode having high flexibility in design can be manufactured owing to its diversity in emission wavelength, simplicity in manufacturing process and others.

The organic laser can be roughly divided into an optically pumped organic laser and a current-pumped organic laser. In the optically pumped organic laser, optical energy (typically, irradiation with laser beams) pumps an organic material to produce excitons, and the light is emitted when the produced excitons recombine with each other. The light emission is amplified by stimulated emission, and is taken out as a laser beam. In the current-pumped organic laser, electric energy (i.e., application of a voltage across an anode and a cathode) is used for injecting holes and electrons into a laser active layer (light emitting layer). The anode injects the holes into the laser active layer (light emitting layer), and the cathode injects the electrons into the laser active layer (light emitting layer). Thereby, the holes and electrons recombine with each other in the laser active layer (light emitting layer) to emit the light, which is amplified by the stimulated emission and is taken out as the laser beam. The former has been reported in many publications and articles, but the latter is not yet actualized.

In either of the optically pumped organic laser and the current-pumped organic laser, it is required that a threshold (ASE threshold) for causing ASE (Amplified Spontaneous Emission) is sufficiently low.

T. Aimoto, Y. Kawamura, K. Goushi, H. Yamamoto, H. Sasabe, and C. Adachi, Appl. Phys. Lett. 86, 071110 (2005) has disclosed the followings 4,4'-bis-(N-carbazole)-biphenyl (CBP) thin film which is represented by the following formula (4) and is doped with 6 weight % of 4,4'-bis-[(N-carbazole)styryl]-biphenyl (which may also be referred to as "BSB-Cz" hereinafter) represented by the following formula (3) exhibits an extremely low ASE threshold of about 0.32 $\mu J/cm^2$ when nitrogen gas laser of wavelength of 337 nm (pulse width of 500 ps) is used as a pumping light source.

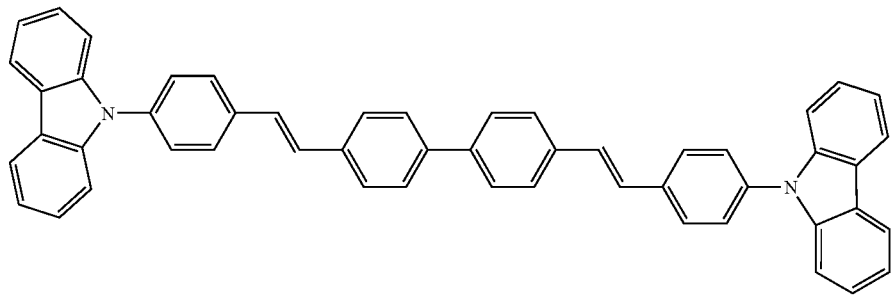

(3)

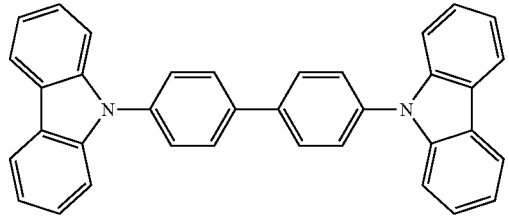

(4)

H. Nakanotani, C. Adachi, S. Watanabe, and R. Kato, Appl. Phys. Lett. 90, 1 (2007) has disclosed the followings. When the foregoing BSB-Cz: CBP thin film (of 500 nm in thickness) is irradiated with a cw (continuous wave) He—Cd laser beam (of 325 nm in excitation wavelength), light having an extremely narrow FWHM (Full Width at Half maximum) can be emitted with a low excitation power of about 15 $W/cm^2$.

However, the optically pumped organic laser requires another light source for pumping a laser active material so as to obtain the laser beam, resulting in a problem of increase in size of a device and others. Therefore, it has been desired to actualize the current-pumped type of organic laser diode.

An organic EL device has been known as a light emitting device for emitting light from an organic pigment material without using a light source for pumping. The organic EL device is usually formed of an anode layer, hole injection/transport layer, light emitting layer, electron injection/transport layer and cathode layer layered in this order. When a voltage is applied across the anode and cathode layers to inject the holes and electrons into the light emitting layer, the light emitting layer emits the light. However, the light obtained from the organic EL device usually exhibits a wide angular distribution as well as a wide spectral width (low monochromaticity).

Many researches have been conducted for actualizing the laser diode by passing a large current through the organic EL device. However, this suffers from many problems such as (1) destruction or deterioration of an organic film due to heat generation with a large current density, (2) deactivation of excitons at a large current density due to interaction between excitons or interaction between excitons and polarons, (3) optical propagation loss due to light absorption by excitons, polarons and electrodes, and others. Each of these problems is remarkable in the current-pumped organic laser, and countermeasures are required for all of these problems. However, these problems are not yet overcome sufficiently.

SUMMARY OF THE INVENTION

The present invention has been developed for overcoming the above problems, and an object of the invention is to provide an organic EL device that can provide light having an extremely narrow spectral width even under excitation with a low energy density (current density).

The present invention provides an organic electroluminescence device including a substrate, an anode layer, an organic layer including at least one organic material and a cathode layer. In the organic electroluminescence device, a primary light outgoing direction is parallel to a surface of the substrate, and any one of cutoff wavelengths in a transverse electric mode of an optical waveguide formed by the device and having a core layer partially formed of the organic layer is within a wavelength range of a full width at half maximum of a fluorescence spectrum of any one of the organic materials included in the organic layer.

Preferably, at least one of the anode layer and the cathode layer is an electrode layer transparent to the light of any one of the cut-off wavelengths. The transparent electrode layer indicates an electrode layer allowing passing of 50% or more of light, and includes, e.g., a transparent and electrically conductive oxide, a metal thin film and the like.

Preferably, the organic layer has a layered structure formed of a plurality of layers. More preferably, the organic layer has a hole injection/transport layer on a side in contact with the anode layer and has an electron injection/transport layer on a side in contact with the cathode layer.

Preferably, a refractivity of any one of the organic materials included in the organic layer at the cut-off wavelength is higher than a refractivity of the anode layer.

Preferably, a surface of the substrate is transparent to the light of any one of the cut-off wavelengths. To be transparent means to allow passing of 50% or more of the light.

Preferably, a refractivity of a surface of the substrate at any one of the cut-off wavelengths is 1.7 or lower. Further preferably, the substrate is a glass substrate, or is a silicon substrate having a silicon oxide film at its surface.

Preferably, the organic layer contains a laser-active material. More preferably, the organic layer contains a compound containing a portion represented by the following formula (1). Further preferably, the organic layer contains a compound represented by the following formula (2),

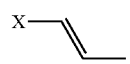 (1)

where X represents a substituted or non-substituted alkyl group, aryl group or heterocyclic ring group.

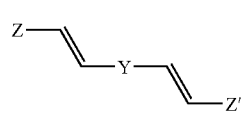 (2)

where each of Y, Z and Z' independently represents a substituted or non-substituted alkyl group, aryl group or heterocyclic ring group.

Preferably, the cathode layer contains Ag.

Preferably, the organic layer has a thickness in a range from 100 nm to 1000 nm. A peak wavelength of the outgoing light varies depending on the thickness of the organic layer. In the organic electroluminescence device of the present invention, the peak wavelength of the outgoing light can be controlled by changing the thickness of the light emitting layer.

The hole injection/transport layer preferably contains a metal oxide, and particularly preferably contains a molybdenum oxide.

The electron injection/transport layer preferably contains a group I element or a group II element as a dopant, and particularly preferably contains cesium as a dopant.

Preferably, the anode layer has a thickness in a range from 3 nm to 100 nm.

Preferably, the anode layer consists of a transparent and electrically conductive oxide.

In the organic electroluminescence device of the present invention, the laterally outgoing light has a feature common to that of laser beams. The light emitted from an edge exhibits high coherency and high monochromaticity. Preferably, emitted light is optically amplified.

The present invention provides the edge emitting type organic EL device that can emit the light having a narrow spectral width even under excitation of a low energy density (current density). According to the organic EL device of the present invention, the emitted light peak wavelength can be changed only by changing the film thickness of the light emitting layer so that a plurality of organic EL devices exhibiting the desired emitted light peak wavelength in an arbitrary visible range can be manufactured without difficulty.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
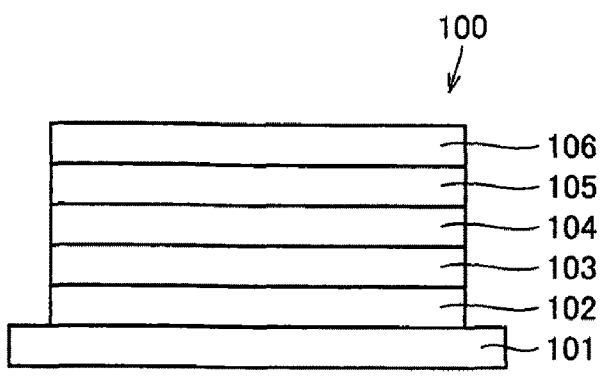
FIG. 1 is a schematic cross section view showing an example of an organic EL device according to the present invention.

FIG. 1 is a schematic cross section view showing an example of an organic EL device of the present invention. An organic EL device 100 shown in FIG. 1 is formed on a substrate 101, and includes an anode layer 102, a hole injection/transport layer 103, a light emitting layer 104, an electron injection/transport layer 105 and a cathode layer 106 layered in this order from the side of substrate 101. Although the organic layer has a layered structure formed of hole injection/transport layer 103, light emitting layer 104 and electron injection/transport layer 105, another structure may be employed.

Substrate 101 may be formed of, e.g., a glass substrate, a silicon substrate having an $SiO_2$ oxide film at its surface, an $SiO_2$ substrate, a sapphire substrate, a silicon substrate, a GaAs substrate, a GaNInP substrate, a plastic substrate made of polymer or the like. A primary light outgoing direction of the organic EL device of the present invention is parallel to a surface of the substrate. In this description, the direction parallel to the surface of the substrate represents a direction not exceeding 45 degrees with respect to the surface of the substrate. However, the light propagated in the direction parallel to the surface of the substrate may be taken out in a perpendicular direction by reflecting the light to the perpendicular direction by a mirror or the like.

In the organic EL device of the present invention, it is preferable, for efficiently confining the light in the optical waveguide, that a refractivity of the surface of the substrate at any one of cut-off wavelengths in the transverse electric mode of the optical waveguide formed in the light emitting device is smaller than a refractivity of any one of the organic materials included in the organic layer, and it is preferable that the refractivity of the surface of the substrate at the cut-off wavelength is equal to or lower than about 1.7. In view of cost reduction and easy manufacturing, it is preferable to employ a glass substrate or to employ a silicon substrate having a silicon oxide film at its surface. It is also preferable that the substrate surface is transparent with respect to the light of any one of the cut-off wavelengths in the transverse electric mode of the optical waveguide formed in the light emitting device.

The optical waveguide and the cut-off wavelength will be described later.

Anode layer 102 has a function of injecting holes into hole injection/transport layer 103. The anode layer is preferably formed of a metal, an alloy thereof, an electrically conductive compound or the like having a large work function (preferably, 4 eV or more). For obtaining light of a narrow spectral width, it is preferable that the anode layer is transparent to the light of any one of the cut-off wavelengths in the transverse electric mode of the optical waveguide formed in the light emitting layer. Electrically conductive materials such as ITO (Indium Tin Oxide), IZO (Indium Zinc Oxide), $SnO_2$, ZnO and AZO (Aluminum Zinc Oxide) as well as metals such as Au are specific examples of a material of such anode layer. It is preferable that anode layer 102 usually has a thickness from 3 nm to 100 µm, and more preferably, it has a thickness from 3 nm to 50 nm in view of optical propagation loss.

Specific examples of the organic material forming the organic layer (hole injection/transport layer 103, light emitting layer 104 and electron injection/transport layer 105) are, e.g., carbazole derivative, triazole derivative, oxazole derivative, oxadiazole derivative, imidazole derivative, polyarylalkane derivative, pyrazoline derivative, pyrazolone derivative, phenylenediamine derivative, arylamine derivative, amino-substituted chalcone derivative, styrylanthracene derivative, fluorenone derivative, hydrazone derivative, stilbene derivative, silazane derivative, aromatic tertiary amine compound, styrylamine compound, aromatic dimethylidyne compound, porphyrin compound, polysilane compound, polyvinylcarbazole derivative, aniline-based copolymer, thiophene oligomer and polythiophene.

In the present invention, it is preferable that the refractivity of any one of the organic materials of the organic layer at any one of the cut-off wavelengths is higher than the refractivity of anode layer 102.

Light emitting layer 104 has a function of emitting the light by recombining the injected holes and electrons. The organic semiconductor material forming light emitting layer 104 is preferably a laser-active material, i.e., a material capable of laser oscillation, and is further preferably a material having a low oscillation threshold (ASE threshold). By selecting such an organic semiconductor material, light having a narrow spectral width can be obtained by the application of the voltage. It is considered that the material of a lower oscillation threshold (ASE threshold) can cause the laser oscillation even at a lower current density.

From a viewpoint of the refractivity and ASE threshold, a compound containing a portion represented by the foregoing formula (1) can be the preferable organic semiconductor material. A compound represented by the foregoing formula (2) is further preferable. BSB-Cz represented by the foregoing formula (3) can be a specific example of the compound represented by the foregoing formula (2). The photoluminescent efficiency and ASE threshold of the BSB-Cz monolayer film are 77% and about 0.6 µJ/cm², respectively.

The BSB-Cz doped with an acceptor may be preferably used as hole injection/transport layer 103. Specifically, the dopant is preferably selected from among various metal oxides such as $MnO_x$, $WO_3$, $SnO_2$, $In_2O_3$ and ZnO, and molybdenum oxide ($MoO_x$) is particularly preferable because it can effectively improve the hole injection characteristics. The dopant concentration may be in a range from 1 mass % to 100 mass %.

Hole injection/transport layer 103 usually has a thickness in a range from 0.2 nm to 100 nm. In view of optical deactivation by the doping, a smaller thickness from 0.2 nm to 30 nm is preferable.

The BSB-Cz monolayer film and the BSB-Cz layer doped with $MoO_x$ exhibit the refractivities of substantially the same value. When the refractivities is measured by an ellipsometer (Fast Spectroscopic Ellipsometer M-2000U manufactured by J. A. Woollam Corp.), the refractivity is about 2.2 when the wavelength of light is 450 nm, is about 2.1 when the wavelength of light is 470 nm, is about 2.0 when the wavelength of light is 550 nm, and is about 1.9 when the wavelength of light is 650 nm. When anode layer 102 is made of ITO, its refractivity to the light from about 400 nm to 700 nm in wavelength is from about 2.0 to about 1.8 so that the foregoing conditions of the refractivity are satisfied.

The material forming electron injection/transport layer 105 is not particularly restricted, and may be a known organic semiconductor material, but it is preferable to use the foregoing BSB-Cz as its host material for preventing carrier trap at an interface between it and the light emitting layer. In this case, a group I element such as cesium or potassium, or a group II element such as magnesium or calcium can be preferably used as the dopant, of which concentration can be from 1 mass % to 50 mass %. The thickness of the electron injection/transport layer may be usually from 0.2 nm to 200 nm, and is preferably from 0.2 nm to 100 nm in view of a production process and the like.

The whole thickness of the organic layers may be in a range, e.g., from 100 nm to 1000 nm.

If the thickness of the light emitting layer were smaller than 100 nm, the light propagation inside the organic layer would be likely to become difficult. If the thickness of the light emitting layer exceeded 300 nm, the driving voltage would rise and the manufacturing process would require a long time. Therefore, it is more preferable that the thickness of light emitting layer 104 is from 100 nm to 300 nm.

Cathode layer 106 has a function of injecting electrons into electron injection/transport layer 105. The cathode layer is preferably formed of a metal, an alloy thereof, an electrically conductive compound having a small work function (preferably, 4 eV or less) or the like. Specific examples of the cathode material are Ag, Mg, Mg—Ag alloy, Al, Al—Li alloy, Al/$Al_2O_3$ mixture, In and the like. For suppressing the propagation loss, Ag having a high reflectivity is particularly preferable. The thickness of cathode layer 106 is usually from about 5 nm to about 500 nm, and is preferably from about 10 nm to about 200 nm.

Figure 2:
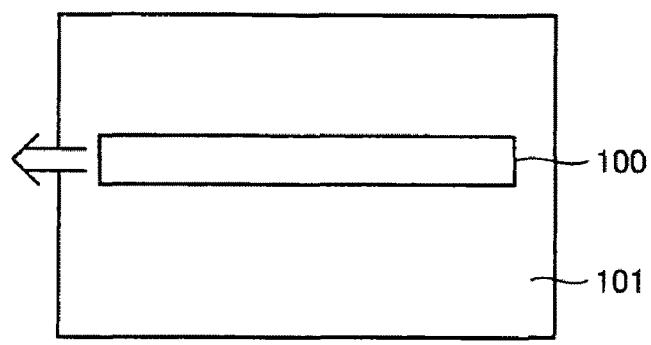
FIG. 2 is a schematic top view of the organic EL device shown in FIG. 1.

FIG. 2 is a schematic top view of organic EL device 100 shown in FIG. 1. As shown in FIG. 2, the organic EL device of the present invention preferably has a substantially rectangular form in a top view. In this case, an edge or end surface having a shorter side is a primary light outgoing surface as indicated by an arrow in FIG. 2. This form can increase the quantity of the outgoing light. Further, a heat radiation property can be higher than those of a circular form and a regular square form. The lengths of the sides of the rectangular form are not particularly restricted, and may be, e.g., from 5 μm×500 μm to 500 μm×2000 μm.

In view of durability of the organic EL device, it is preferable that the organic EL device of the present invention is sealed. For example, the sealing method of the organic EL device may employ sealing in a nitrogen atmosphere or an argon atmosphere using a glass sealing can, or sealing by deposition of $SiO_x$ film, $SiN_x$ film or parylene film, or the like.

The organic EL device of the present invention can provide the light that has a narrow spectral width (high monochromaticity) and is emitted in a direction parallel to the surface of the substrate at an extremely low current density. The light outgoing from the organic EL device of the present invention may be accompanied with amplification of the light generated in the light emitting layer. This will be described later.

In the present invention, the oscillation of the emitted light having the extremely narrow spectral width at the extremely low current density is allowed because, out of the light beams in the light generated by the light emitting layer, particularly the light beams that have the wavelengths close to the cut-off wavelength of the optical waveguide formed by respective layers of the device are overlapped coherently (i.e., to match phases of light beams) with each other, and are emitted in the direction substantially parallel to the substrate surface. Thus, in the organic EL device of the present invention, the cut-off wavelength is within the wavelength region of the full width at half maximum of the fluorescence spectrum of any one of the organic materials included in the organic layer, and "the light beams that have the wavelengths close to the cut-off wavelength" have the wavelength close to the wavelength causing total reflection at the interface between a core layer and a clad layer of the optical waveguide so that the "light beams that have the wavelengths close to the cut-off wavelength" are emitted in the direction substantially parallel to the substrate surface based on an optical phenomenon. The intensity of the light emitted in the direction substantially parallel to the substrate surface depends on the quantity of light that have the wavelengths close to the cut-off wavelength and are within the wavelength region of the full width at half maximum of the fluorescence spectrum of any one of the organic materials in the organic layer, included in the light generated by the light emitting layer. The amplification of the emitted light is relatively likely to occur when the wavelength of the light matches the wavelength of 0-1 transition.

The optical waveguide consists of the core layer through which the light is guided and the clad layer confining the light in the core layer. In the organic EL device shown in FIG. 1, the core layer corresponds to the layered structure of anode layer 102 and the organic layer (hole injection/transport layer 103, light emitting layer 104 and electron injection/transport layer 105). The clad layer corresponds to substrate 101 (e.g., glass substrate), cathode layer 106 and an air. The optical waveguide has the wavelength called cut-off wavelength, and the cut-off wavelength corresponds to the wavelength that causes the total reflection at the interface between the core and clad layers.

The edge emission near the cut-off wavelength is specifically described, e.g., in (1) M. Pauchard, M. Vehse, J. Swensen, D. Moses, A. J. Heeger, E. Perzon, and M. R. Andersson, Appl. Phys. Lett. 83, 4488 (2003), and (2) F. Li, O, Solomesch, P. R. Mackie, D. Cupertino, and N. Tessler, J. Appl. Phys. 99, 013101 (2006).

Another feature of the organic EL device of the present invention is that the peak wavelength of the outgoing light can be controlled by adjusting the thickness of the light emitting layer. For example, the organic EL device is formed of the anode layer (ITO of 30 nm), the hole injection/transport layer (BSB-Cz doped with 7 mass % of $MoO_x$ of 10 nm, the light emitting layer (BSB-Cz of L nm), the electron injection/transport layer (BSB-Cz doped with 20 mass % of Cs of 60 nm) and the cathode layer (Ag of 100 nm), and the thickness (L) of the light emitting layer is changed in a range from 100 nm to 150 nm. In this case, the peak wavelength attaining the highest emission intensity changes within a range from 450 nm to 500 nm, and the larger thickness of the light emitting layer increases the cut-off wavelength of the optical waveguide, and thus allows emission of the light of the higher wavelength close to the cut-off wavelength.

In the organic EL device shown in FIG. 1, when the organic layer containing the organic material having a higher refractivity than the substrate as well as the transparent anode layer are selected, the optical waveguide in which the organic layer and the anode layer are located between the substrate of a low refractivity and the cathode layer of a high refractivity is formed. As described above, the optical waveguide is formed of the core layer consisting of the organic layer and the transparent anode layer as well as the clad layer including the substrate, the cathode layer and the air. The cut-off wavelength of this optical waveguide is defined as the upper limit of the wavelength that can confine the light in the optical waveguide in each of the modes (TE0, TM0, TE1, TM1, TE2, TM2, . . . ). The value of the cut-off wavelength is uniquely determined according to the kind of material forming the optical waveguide, the optical constant thereof and the structure, and is generally obtained by numerical calculation.

The above calculation may employ the methods described in D. Marcuse, Theory of Dielectric Optical Waveguides, 2nd ed. (Academic Press, San Diego, 1990) and in D. Yokoyama, M. Moriwake, and C. Adachi, J. Appl. Phys. 103, 123104 (2008).

As already described, the light that has the wavelength close to the cut-off wavelength (e.g., light having a wavelength slightly larger than the cut-off wavelength) is emitted substantially in the parallel to the device surface. The propagation loss due to the cathode is less likely to occur in the light beam in the transverse electric mode (i.e., TE mode) included in the outgoing light that has the wavelength close to the cut-off wavelength, and therefore this light beam has an extremely narrow spectral width.

The present invention will be described more specifically with reference to the examples and the comparative examples, but the present invention is not restricted to them.

EXAMPLE 1

Figure 3:
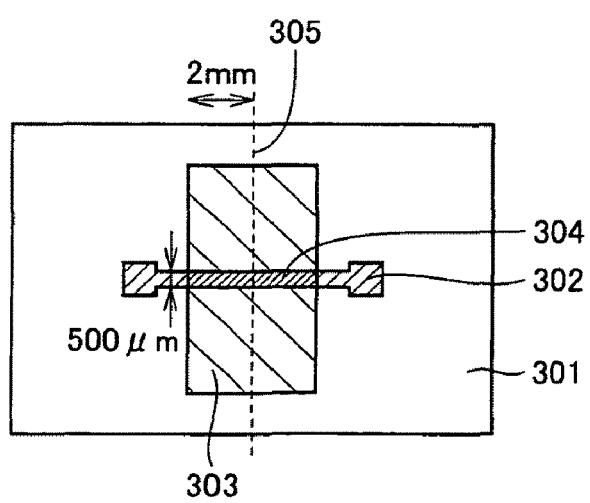
FIG. 3 is a schematic top view of an organic EL device of Example 1.

This will be described with reference to FIG. 3. FIG. 3 is a schematic top view showing a structure of an organic EL device manufactured in this example. First, a photoresist film having an aperture of 500 μm in width and 8000 μm in length was formed on a glass substrate 301 by photolithography and lift-off. Then, RF magnetron sputtering was executed to form an ITO layer of 30 nm in thickness over whole glass substrate 301 (ITO target: 10 mass % of $SnO_2$ and 90 mass % of $In_2O_3$, flow rate: Ar 30 sccm, pressure: about $1 \times 10^{-1}$ Pa, PF power: 20 W). Then, the photoresist film was removed together with the ITO film formed thereon to provide a substrate having a patterned anode layer 302 (ITO layer). This substrate was cleaned with a detergent and an organic solvent, and was subjected to UV-ozone processing.

Then, a hole injection/transport layer, a light emitting layer and an electron injection/transport layer forming an organic layer were formed in this order by vacuum heating deposition over the whole substrate surface (pressure: $3 \times 10^{-3}$ Pa or lower, deposition rate: about 0.2 nm/s). The hole injection/transport layer was made of BSB-Cz doped with 7 mass % of $MoO_x$, and had a layer thickness of 10 nm. The light emitting layer was made of BSB-Cz, and had a layer thickness of 100 nm. The electron injection/transport layer was made of BSB-Cz doped with 20 mass % of Cs, and had a layer thickness of 60 nm. All the three layers were in an amorphous state. Then, thermal deposition using a shadow mask was performed to form an Ag layer of 100 nm in thickness as a cathode layer 303 on the electron injection/transport layer (pressure: $3 \times 10^{-3}$ Pa or lower, deposition rate: about 0.1 nm/s). Thereby, the device structure shown in FIG. 3 was obtained. Finally, the substrate was cut out together with the device by a glass cutter along a division line 305 shown in FIG. 3 to provide an organic EL device of a linear form. An active region 304 had sizes of 500 μm×2 mm.

EXAMPLES 2 AND 3

Organic EL devices were manufactured in the similar manner as the Example 1 except for that light emitting layers have thicknesses of 130 nm and 150 nm, respectively.

In the manufactured devices having the above film thicknesses, calculated values of the cut-off wavelengths of the optical waveguides were 456 nm, 479 nm and 499 nm with respect to the TE1 mode, respectively. As described later, these values are within the wavelength region of the full width at half maximum of the fluorescence spectrum of the BSB-Cz.

COMPARATIVE EXAMPLES 1-2

Processing of and before the formation of the electron injection/transport layer was performed similarly to Example 1 except for forming an ITO layer as the anode layer (the light emitting layer had the layer thickness of 130 nm (Comparative Example 1) or 150 nm (Comparative Example 2). Then, thermal deposition using a shadow mask was performed to form a circular Ag layer of 1 mm in diameter and 100 nm in layer thickness on the electron injection/transport layer so that a surface emission type organic EL device was obtained.

COMPARATIVE EXAMPLE 3

An edge emitting type organic EL device was manufactured similarly to Example 1 for that tris-(8-hydroxyquinoline) aluminum ($Alq_3$) was used instead of the BSB-Cz as the organic semiconductor materials of the hole injection/transport layer and the electron injection/transport layer. The light emitting layer had the layer thickness of 180 nm, and the refractivity of $Alq_3$ at the peak wavelength of the light of the largest emission intensity is about 1.7.

[Characteristic Evaluation of Organic EL Device]

(1) Current Density to Voltage (J-V) Characteristics

Figure 4:
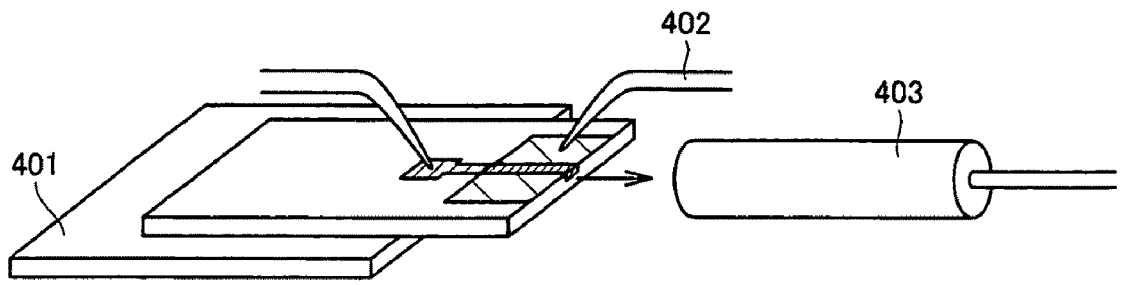
FIG. 4 schematically shows a method of measuring current density-voltage characteristics and an edge-emitted spectrum.
Figure 5:
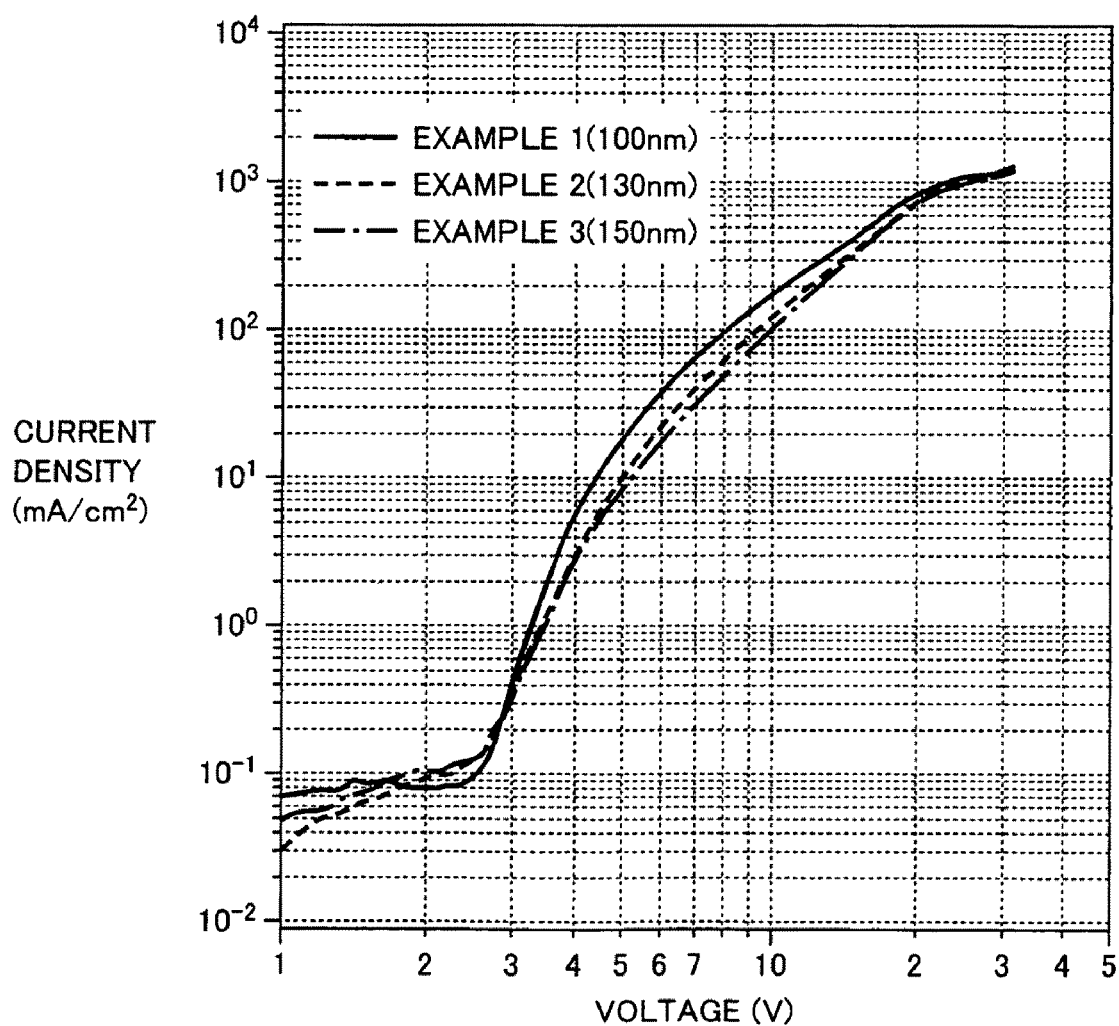
FIG. 5 shows the current density-voltage characteristics of organic EL devices of Examples 1-3.

The J-V characteristics were measured and obtained from the organic EL devices of Examples 1-3 having the light emitting layers of 100 nm, 130 and 150 nm in thickness, respectively. As shown in FIG. 4, the measurement was performed by placing the organic EL device formed on the glass substrate on a stage 401, and applying a voltage across the anode and cathode layers with a contact probe 402. A semiconductor parameter analyzer (E5250 manufactured by Agilent Technologies Inc.) was used for measuring the J-V characteristics. A result is shown in FIG. 5.

(2) Emission Spectrum Outgoing from Edge

As shown in FIG. 4, the emission spectrum was measured by collecting the light emitted from the edge, using a multi-channel spectrometer (PMA-11 manufactured by Hamamatsu Photonics Co.) provided with an optical fiber 403 that has a light receiving unit of 1 mm in diameter. Optical fiber 403 was located at the same height as the device and was parallel to the device surface.

Figure 6A:
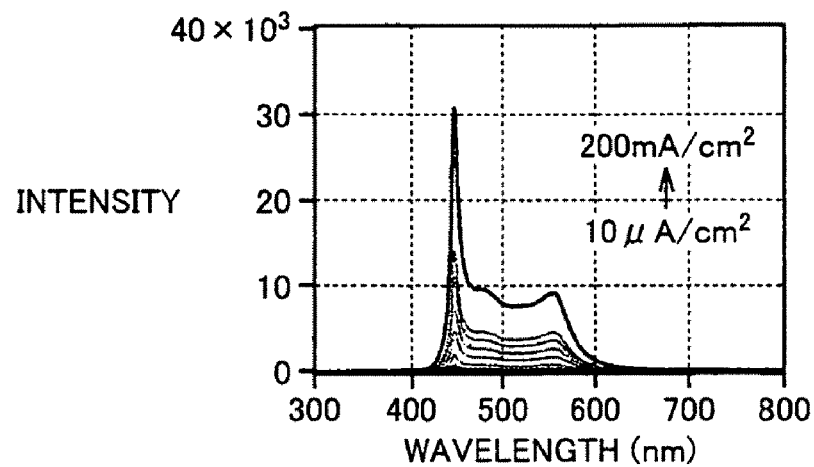
FIGS. 6A-6C show emission spectra of light emitted from edges of the organic EL devices of Examples 1-3, respectively.
Figure 6B:
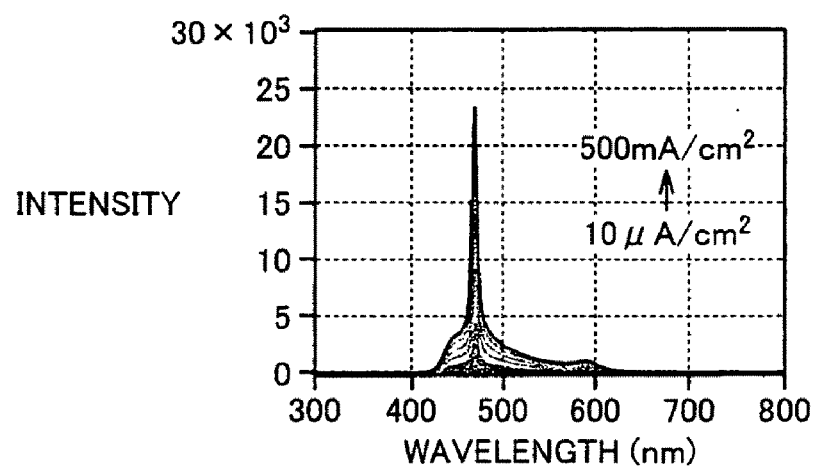
Figure 6C:
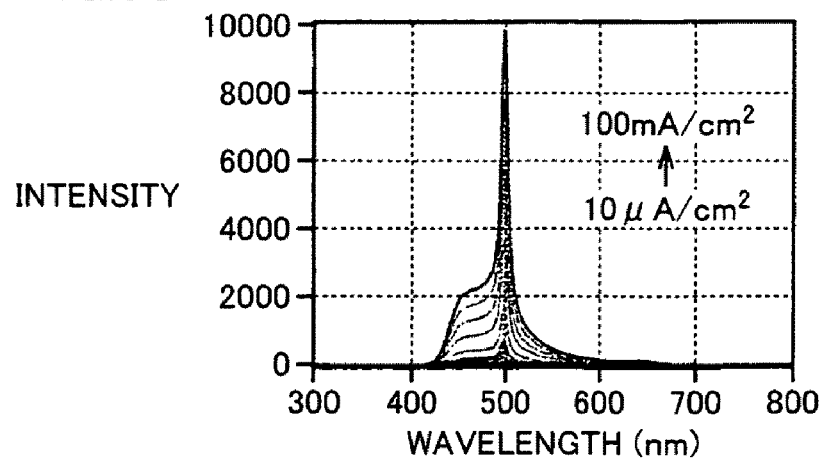
Figure 7:
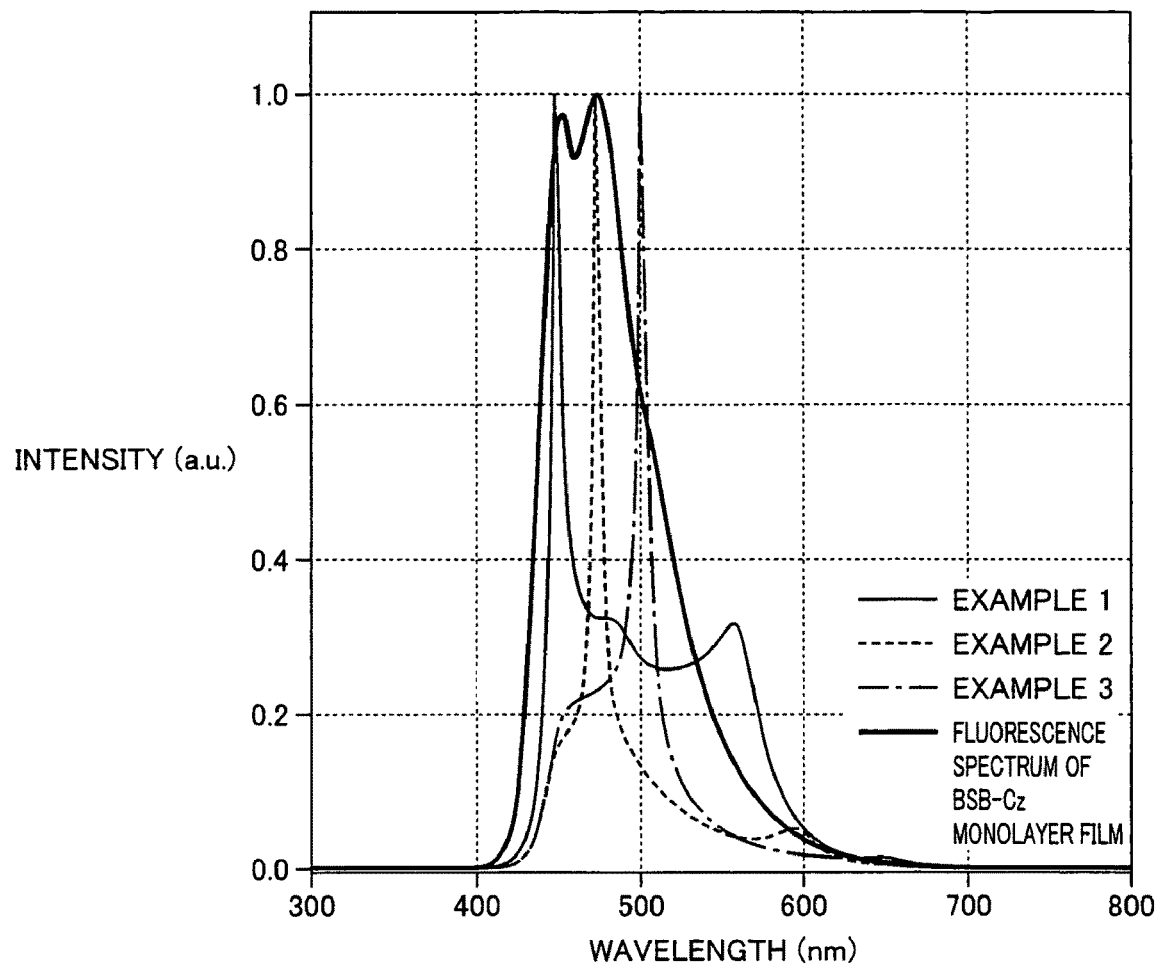
FIG. 7 shows, in an overlapping fashion, the emission spectra at a current density of 100 mA/cm² of the light outgoing from the edges of organic EL devices of Examples 1-3.

FIGS. 6A-6C represent emission spectra of the light outgoing from the organic EL device edges. FIG. 6A shows an emission spectrum exhibited when the current density changes from 10 μA/$cm^2$ to 200 mA/$cm^2$ in the organic EL device of Example 1 having the light emitting layer of 100 nm in thickness. FIG. 6B shows an emission spectrum exhibited when the current density changes from 10 μA/$cm^2$ to 500 mA/$cm^2$ in the organic EL device of Example 1 having the light emitting layer of 130 nm in thickness. FIG. 6C shows an emission spectrum exhibited when the current density changes from 10 µA/cm$^2$ to 100 mA/cm$^2$ in the organic EL device of Example 3 having the light emitting layer of 150 nm in thickness. FIG. 7 shows, in an overlapping fashion, the emission spectra of the light outgoing from the organic EL device edges of Examples 1-3 at the current density of 100 mA/cm$^2$, respectively. Each emission spectrum is standardized to exhibit the peak intensity equal to 1. For reference sake, FIG. 7 also shows a fluorescence spectrum of a BSB-Cz monolayer film of about 100 nm in thickness formed on a glass substrate.

As can be seen from a comparison with the fluorescence spectrum of the BSB-Cz monolayer film, the light outgoing from the edge of the organic EL device of each of Examples 1-3 has such features that the light beam having a specific peak wavelength (i.e., the light beam exhibiting the highest emission intensity) exhibits the extremely narrow spectral width. The full width at half maximum (FWHM) of each peak is 12 nm (Example 1, light emitting layer thickness: 100 nm), 6.5 nm (Example 2, light emitting layer thickness: 130 nm) or 11 nm (Example 3, light emitting layer thickness: 150 nm).

It can be seen from FIG. 7 that the peak wavelength of the light having the narrow spectral width depends on the layer thickness of the light emitting layer. Thus, as the layer thickness of the light emitting layer successively increases to 100 nm, 130 nm and 150 nm, the peak wavelength successively increases to 446 nm, 471 nm and 500 nm. As the peak wavelength of the edge emission approaches the wavelength of 0-1 transition of BSB-Cz, the FWHM becomes narrower, and attains 6.5 nm when the thickness of the light emitting layer is 130 nm.

The value of the peak wavelength is extremely close to the foregoing calculated value. It can be seen that this emitted light has the wavelength close to the cut-off wavelength of the optical waveguide. Each of these wavelengths is within the wavelength range of the full width at half maximum of the fluorescence spectrum of the BSB-Cz monolayer film.

(3) The Emission Spectrum of the Light Outgoing from the ITO Surface

Figure 8A:
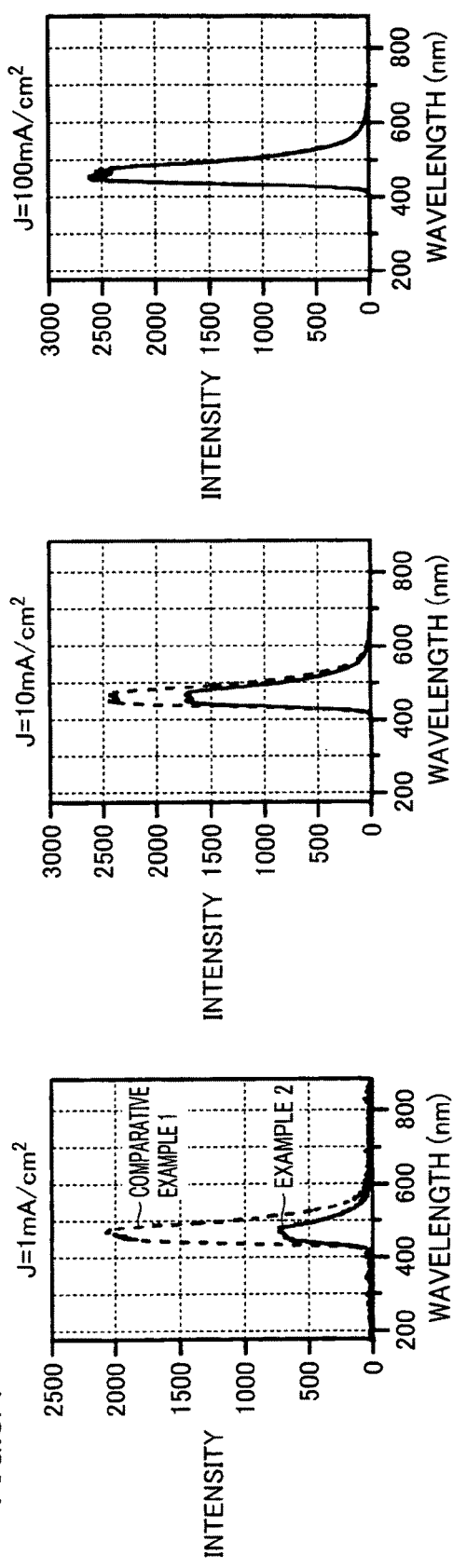
FIGS. 8A and 8B show emission spectra of the light outgoing from ITO surfaces of organic EL devices of Examples 2-3 and Comparative Examples 1-2.
Figure 8B:
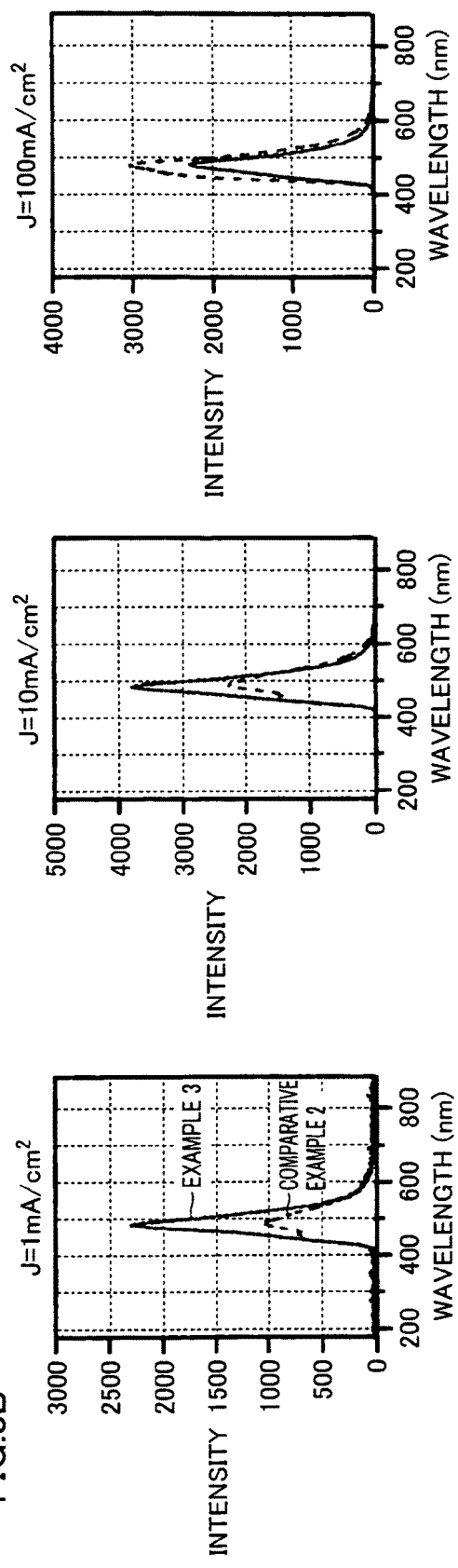

A spectrometer (SD2000 manufactured by Ocean Optics Co.) having an optical fiber was used with an end of the optical fiber located under the substrate, and the emission spectra were measured and obtained from the light outgoing from the ITO surface of the organic EL device of Example 2 (light emitting layer thickness: 130 nm) and Example 3 (light emitting layer thickness: 150 nm) with a current density J successively set to 1, 10 and 100 mA/cm$^2$. FIGS. 8A and 8B show results of Examples 2 and 3, respectively. For comparison, FIGS. 8A and 8B also show the emission spectra of the light outgoing from the ITO surfaces of the organic EL devices of the Comparative Example 1 (light emitting layer thickness: 130 nm) and the Comparative Example 2 (light emitting layer thickness: 150 nm), respectively.

From FIGS. 8A and 8B, it can be seen that the light outgoing from the ITO surfaces of the organic EL devices of Examples 2 and 3 exhibit the broad FWHMs of 50 nm or more, and these FWHM values are substantially equal to that of the ordinary surface emission type of organic EL device.

(4) Polarization Characteristics

Figure 9A:
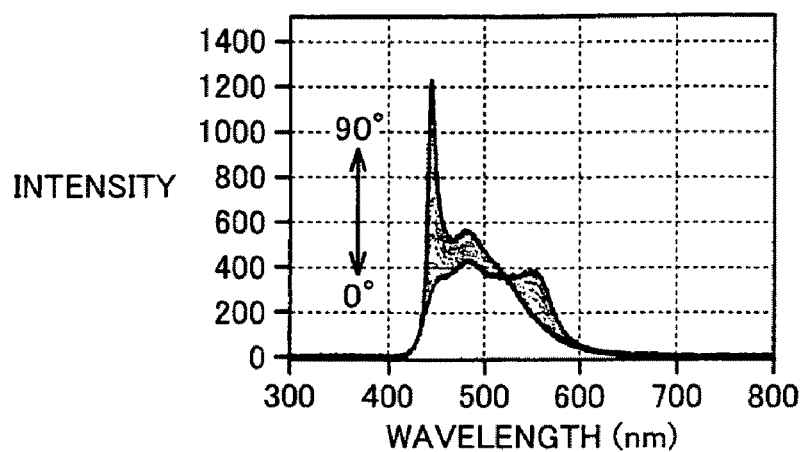
FIGS. 9A-9C show polarization characteristics of the light emitted from the edges of organic EL devices of Examples 1-3.
Figure 9B:
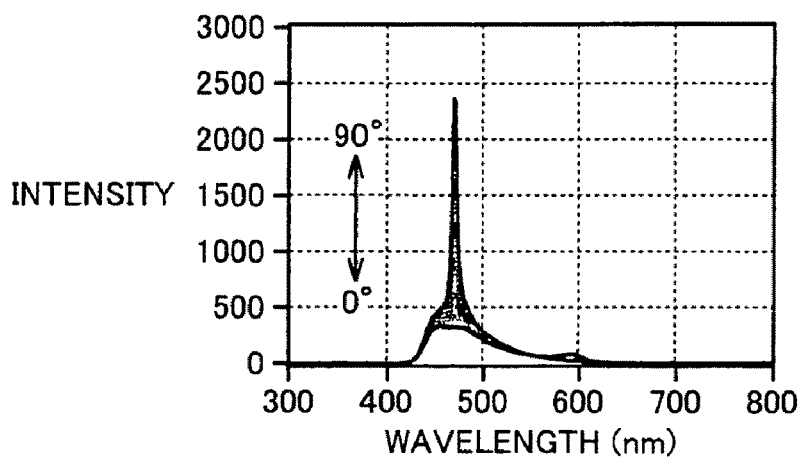
Figure 9C:
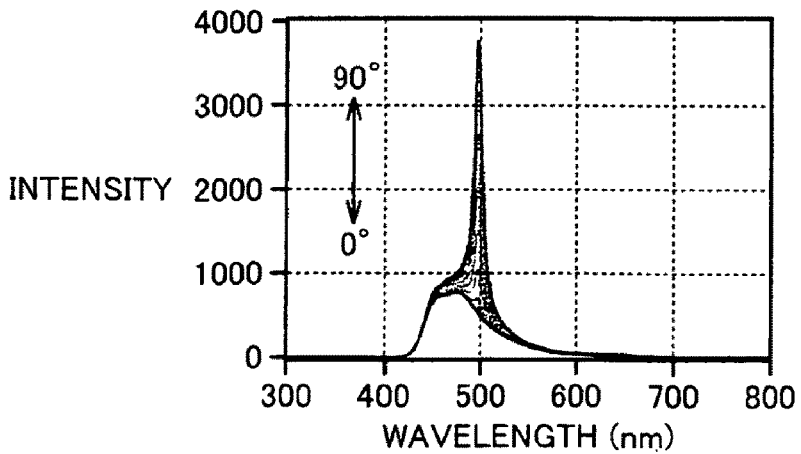

The polarization characteristics of the light outgoing from the edges of the organic EL devices of Examples 1-3 were measured with a rotary polarizer. Results are shown in FIGS. 9A-9C, which show the polarization characteristics of the light outgoing from the edges of the organic EL devices of Examples 1-3, respectively. It can be seen that the light having the narrow spectral width (i.e., the light of the highest emission intensity) is polarized to the direction parallel to the substrate surface (TE mode, the direction of 90 degrees in FIGS. 9A-9C). It can also be seen that light in the TM mode (transverse magnetic mode) of a lower intensity as well as unpolarized light are present.

(5) Current Density Dependence of Emission Intensity

Figure 10A:
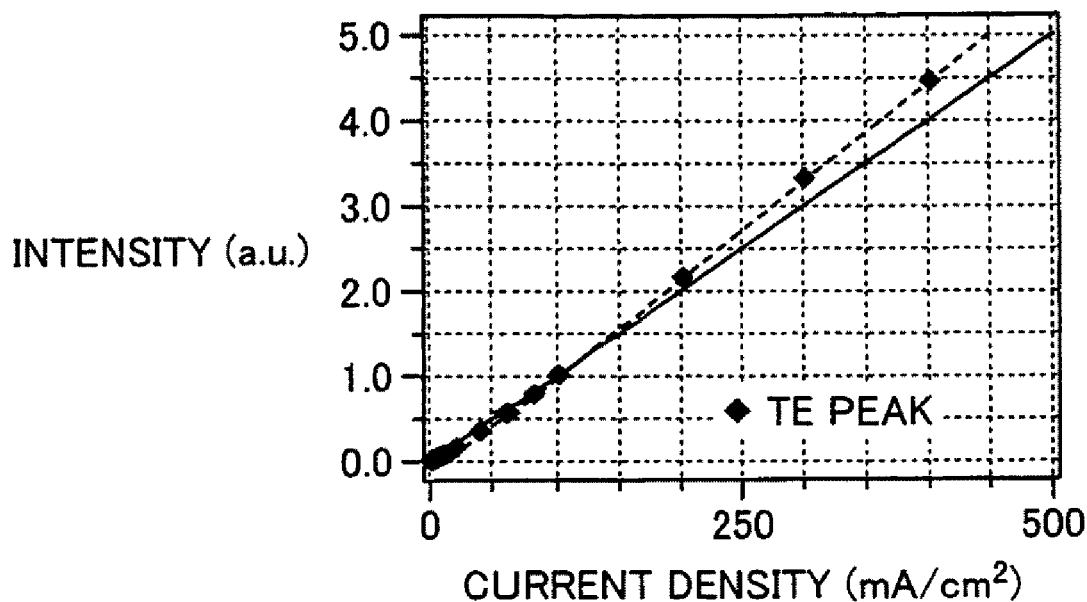
FIGS. 10A and 10B show a relationship between a current density and an emission intensity of the light emitted from the edge of the organic EL device of Example 2.
Figure 10B:
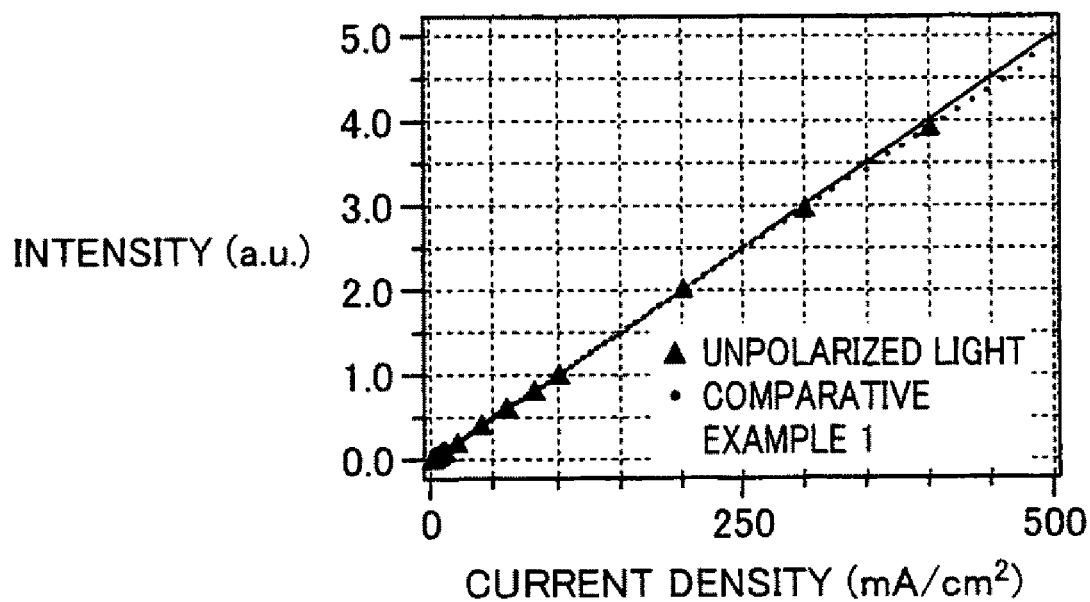

FIGS. 10A and 10B show results of the determination about the relationship between the emission intensity of the light outgoing from the edge of the organic EL device and the current density. FIG. 10A shows the relationship between the emission intensity and the current density relating to the TE peak (i.e., the peak of peak wavelength of 471 nm) among the emission spectra of the light outgoing from the edge of the organic EL device of Example 2. For the reference sake, FIG. 10A shows a straight proportion line passing through the origin. The emission intensity is standardized to attain 1 when the current density is 100 mA/cm$^2$. As can be seen from FIG. 10A, an extrapolated line fitted using the emission intensity value at the high current density does not pass through the origin, independently of the proportional relationship between the emission intensity and the current density. FIG. 10B shows the relationship between the emission intensity and the current density relating to the unpolarized light (of 450 nm in wavelength) among the emission spectra of the light outgoing from the edge of the organic EL device of Example 2. FIG. 10B also shows the current density dependence of the surface emission spectrum of the organic EL device of Comparative Example 1. It can be seen that these emission intensities are completely proportional to the current density, and the fitting straight line passes through the origin. Therefore, the deviation from the foregoing proportional relationship is peculiar to the peak having the narrow spectral width.

(6) Changes in Emission Spectrum Form

Figure 11A:
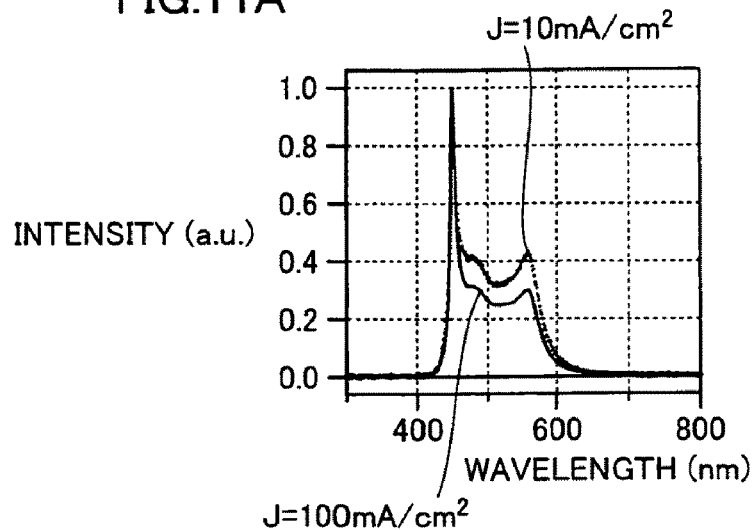
FIGS. 11A-11C show dependence, on the current density, of an emission spectrum form of the light emitted from the edges of the organic EL devices of Examples 1-3.
Figure 11B:
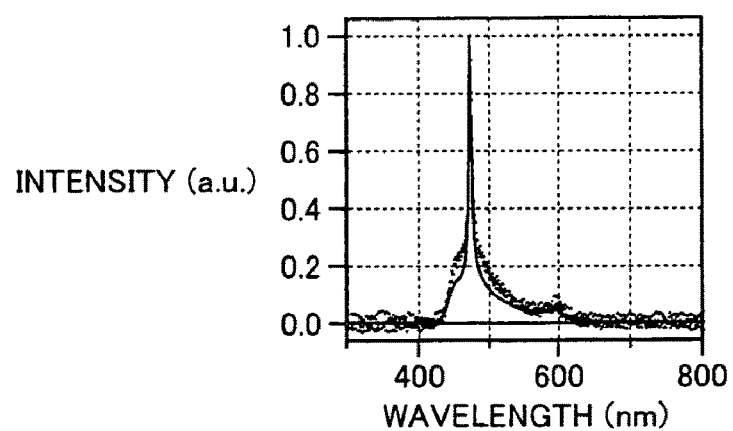
Figure 11C:
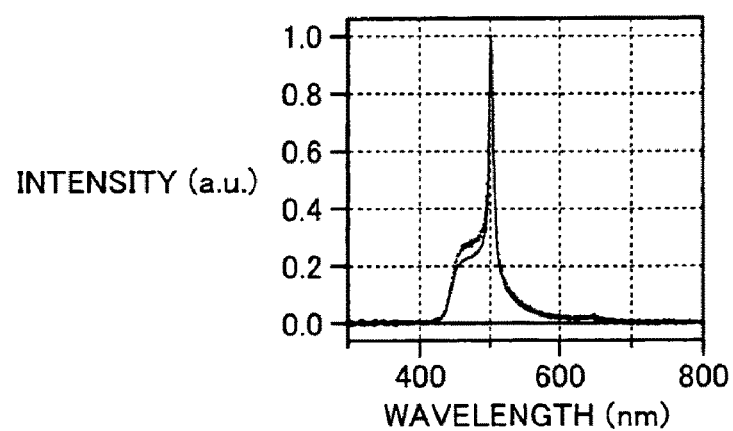

FIGS. 11A to 11C show the current density dependency of the emission spectrum form of the light outgoing from the edges of the organic EL devices of Examples 1-3, respectively. All the emission spectra are standardized to attain the highest peak intensity equal to 1. As can be seen from FIGS. 11A-11C, the current density of 10 mA/cm$^2$ and that of 100 mA/cm$^2$ exhibit different spectrum forms, and the intensity ratio of the peak having the narrow spectra width increases with increase in current density.

(7) Near Field Pattern

Figure 12A:
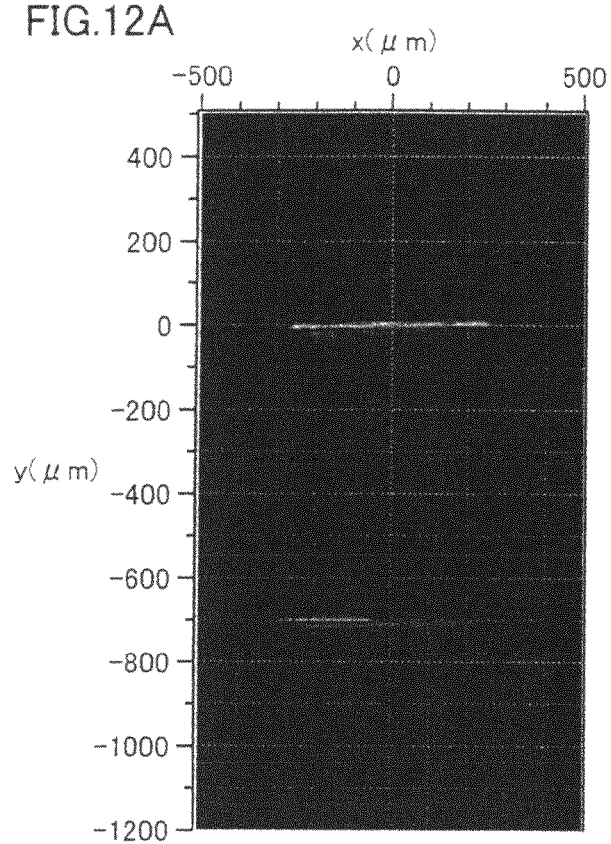
FIGS. 12A-12C show near-field patterns of the edge-emitted light of the organic EL device of Example 2.
Figure 12B:
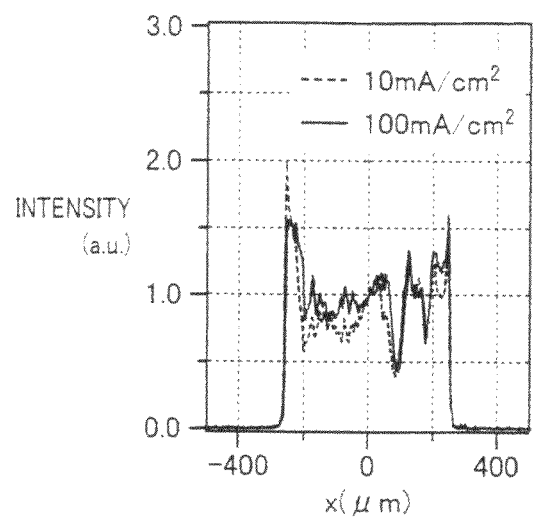
Figure 12C:
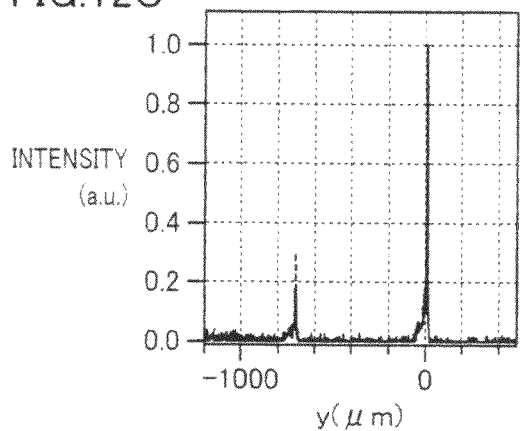

A near field pattern of the edge emission was measured using a beam profiler (LEPAS-12 manufactured by Hamamatsu Photonics Co.). FIG. 12A shows the near field pattern of the edge emission of the organic EL device of Example 2 (current density: 100 mA/cm$^2$), and FIGS. 12B and 12C are cross sections showing the light-distribution pattern at x=0 and y=0 in FIG. 12A with the current density of 10 mA/cm$^2$ and 100 mA/cm$^2$, respectively. In FIG. 12A, the abscissa x gives the width direction of the active region of the organic EL device, and x=0 indicates a center of the active region. The ordinate y gives the thickness direction of the organic EL device, and y=0 indicates the device surface (cathode layer surface). It can be seen from FIG. 12A that the emission position is localized near the device surface (y=0). From FIGS. 12B and 12C, it can be seen that the light distribution pattern does not depend on the current density so much.

(8) Emission Spectrum of the Organic EL Device of the Comparative Example 3

Figure 13:
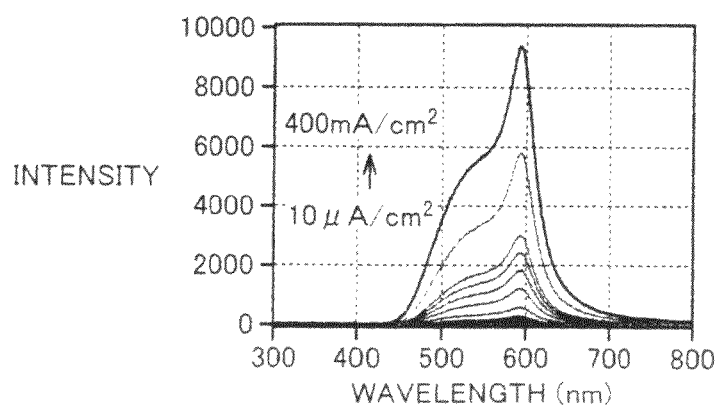
FIG. 13 shows the edge emission spectrum of the organic EL device of the Comparative Example 3 (layer thickness of light emitting layer: 180 nm) exhibited when the current density changes from 10 µA/cm² to 400 mA/cm².

FIG. 13 shows the edge emission spectrum exhibited when the current density changes from 10 µA/cm$^2$ to 400 mA/cm$^2$ in the organic EL device of Comparative Example 3 (light emitting layer thickness: 180 nm). As shown in FIG. 13, the spectral width decreases with increase in current density, but the FWHM thereof is large and equal to about 50 nm.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An organic electroluminescence device comprising:
   a substrate;
   an anode layer;
   an organic layer including at least one organic material having a fluorescence spectrum; and
   a cathode layer,
   wherein the organic electroluminescence device has a primary light outgoing direction that is parallel to a surface of said substrate,
   wherein the organic electroluminescence device has an optical waveguide that includes a core layer formed by said anode layer and said organic layer, and a clad layer formed by said substrate and said cathode layer, and
   wherein said optical waveguide has cutoff wavelengths in a transverse electric mode any one of which is within a wavelength range of a full width at half maximum of the fluorescence spectrum of any one of the organic materials included in said organic layer.

2. The organic electroluminescence device according to claim 1, wherein at least one of said anode layer and said cathode layer is an electrode layer transparent to the light of any one of said cut-off wavelengths.

3. The organic electroluminescence device according to claim 2, wherein said anode layer consists of a transparent and electrically conductive oxide.

4. The organic electroluminescence device according to claim 1, wherein said organic layer has a layered structure formed of a plurality of layers.

5. The organic electroluminescence device according to claim 4, wherein the organic layer having the layered structure formed of said plurality of layers has a hole injection and transport layer on a side in contact with said anode layer and has an electron injection and transport layer on a side in contact with said cathode layer.

6. The organic electroluminescence device according to claim 5, wherein said hole injection and transport layer contains a metal oxide.

7. The organic electroluminescence device according to claim 6, wherein said hole injection and transport layer contains a molybdenum oxide.

8. The organic electroluminescence device according to claim 5, wherein said electron injection and transport layer contains a group I element or a group II element as a dopant.

9. The organic electroluminescence device according to claim 1, wherein refractivity of any one of the organic materials included in said organic layer at said cut-off wavelength is higher than refractivity of said anode layer.

10. The organic electroluminescence device according to claim 1, wherein a surface of said substrate is transparent to the light of any one of said cut-off wavelengths.

11. The organic electroluminescence device according to claim 1, wherein refractivity of a surface of said substrate at any one of said cut-off wavelengths is 1.7 or lower.

12. The organic electroluminescence device according to claim 11, wherein said substrate is a glass substrate.

13. The organic electroluminescence device according to claim 11, wherein said substrate is a silicon substrate having a silicon oxide film at its surface.

14. The organic electroluminescence device according to claim 1, wherein said organic layer contains a laser-active material.

15. The organic electroluminescence device according to claim 1, wherein said organic layer contains a compound containing a portion represented by the following formula (1):

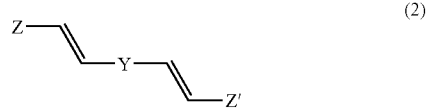

where X represents a substituted or non-substituted alkyl group, aryl group or heterocyclic ring group.

16. The organic electroluminescence device according to claim 15, wherein said organic layer contains a compound represented by the following formula (2):

where each of Y, Z and Z' independently represents a substituted or non-substituted alkyl group, aryl group or heterocyclic ring group.

17. The organic electroluminescence device according to claim 1, wherein said cathode layer contains Ag.

18. The organic electroluminescence device according to claim 1, wherein said organic layer has a thickness in a range from 100 nm to 1000 nm.

19. The organic electroluminescence device according to claim 18, wherein outgoing light has a peak wavelength that varies depending on the thickness of said organic layer.

20. The organic electroluminescence device according to claim 1, wherein said anode layer has a thickness in a range from 3 nm to 100 nm.

21. The organic electroluminescence device according to claim 1, wherein emitted light is optically amplified.

22. The organic electroluminescence device according to claim 21, wherein said organic electroluminescence device is an organic laser diode.

* * * * *